United States Patent
Butterworth et al.

(10) Patent No.: US 7,254,153 B2
(45) Date of Patent: Aug. 7, 2007

(54) OPTICALLY PUMPED SEMICONDUCTOR RING LASER

(75) Inventors: Stuart Butterworth, San Jose, CA (US); Andrea Caprara, Menlo Park, CA (US); R. Russel Austin, Half Moon Bay, CA (US)

(73) Assignee: Coherent, Inc., Santa Clara, CA (US)

( * ) Notice: Subject to any disclaimer, the term of this patent is extended or adjusted under 35 U.S.C. 154(b) by 217 days.

(21) Appl. No.: 11/193,122

(22) Filed: Jul. 29, 2005

(65) Prior Publication Data

US 2005/0265421 A1 Dec. 1, 2005

Related U.S. Application Data

(62) Division of application No. 10/386,005, filed on Mar. 11, 2003, now Pat. No. 6,940,880.

(51) Int. Cl.
*H01S 3/083* (2006.01)

(52) U.S. Cl. .................................. 372/94; 372/93

(58) Field of Classification Search ................ 372/21, 372/98, 70, 92, 94
See application file for complete search history.

(56) References Cited

U.S. PATENT DOCUMENTS

| | | | | |
|---|---|---|---|---|
| 5,068,546 A | * | 11/1991 | Hemmerich et al. | 359/328 |
| 5,206,868 A | * | 4/1993 | Deacon | 372/21 |
| 5,982,805 A | * | 11/1999 | Kaneda | 372/98 |
| 5,991,318 A | | 11/1999 | Caprara et al. | 372/22 |
| 6,097,742 A | | 8/2000 | Caprara et al. | 372/22 |
| 6,198,756 B1 | | 3/2001 | Caprara et al. | 372/22 |
| 6,285,702 B1 | | 9/2001 | Caprara et al. | 372/92 |
| 6,298,076 B1 | | 10/2001 | Caprara et al. | 372/43 |
| 6,404,786 B1 | * | 6/2002 | Kondo et al. | 372/22 |
| 6,526,073 B1 | | 2/2003 | Spinelli et al. | 372/22 |
| 6,574,255 B1 | | 6/2003 | Caprara et al. | 372/45 |

OTHER PUBLICATIONS

A.H. Paxton et al., "Design of external cavities for vertical-cavity semiconductor lasers," *Proceedings of the SPIE—The International Society for Optical Engineering*, vol. 1868, 1993, pp. 235-243.

* cited by examiner

*Primary Examiner*—Minsun Oh Harvey
*Assistant Examiner*—Tuan N. Nguyen
(74) *Attorney, Agent, or Firm*—Stallman & Pollack LLP

(57) ABSTRACT

An optically pumped semiconductor laser includes an active ring-resonator having two or more optically pumped semiconductor (OPS) structures each including a mirror-structure and a multilayer gain-structure. The mirror-structures serve as fold mirrors for the resonator axis. An optically nonlinear crystal may be included in the ring-resonator for generating second-harmonic radiation from fundamental radiation generated in the resonator. Another optically nonlinear crystal may be provided for generating third-harmonic or fourth-harmonic radiation from the second-harmonic radiation. In one example, including a third-harmonic generating crystal, a passive ring-resonator partially coaxial with the active ring-resonator is provided for circulating second-harmonic radiation to provide resonant amplification of the second-harmonic radiation for enhancing third-harmonic conversion. Apparatus for automatically maintaining the passive ring-resonator in a resonant condition for the second-harmonic radiation is disclosed.

35 Claims, 8 Drawing Sheets

OPTICALLY PUMPED SEMICONDUCTOR RING LASER

CLAIM OF PRIORITY

This application is a divisional of U.S. patent application Ser. No. 10/386,005, entitled "OPTICALLY PUMPED SEMICONDUCTOR RING LASER," filed Mar. 11, 2003 now U.S. Pat. No. 6,940,880, which is hereby incorporated herein by reference.

TECHNICAL FIELD OF THE INVENTION

The present invention relates in general to external-cavity optically-pumped semiconductor lasers (hereinafter, OPS-lasers) including a surface-emitting, semiconductor multilayer (periodic) gain-structure. The invention relates in particular to traveling-wave resonator arrangements of such lasers.

BACKGROUND

The term OPS-lasers, as used herein, refers to a class of vertical-cavity surface-emitting semiconductor lasers wherein optical gain is provided by recombination of electrical carriers in very thin layers, for example, about 150 Ångstrom units (Å) or less, of a semiconductor material. These layers are generally termed quantum-well (QW) layers or active layers.

In an OPS-laser, several QW layers, for example, about fifteen, are spaced apart by separator layers also of a semiconductor material, but having a higher conduction band energy that the QW layers. This combination of active layers and separator layers may be defined as the gain-structure of the OPS-laser. The layers of the gain-structure are epitaxially grown. On the gain-structure is an epitaxially grown multilayer mirror-structure, often referred to as a Bragg mirror. The combination of mirror-structure and gain-structure is referred to hereinafter as an OPS-structure.

In an (external cavity) OPS-laser, another (conventional) mirror, serving as an output-coupling mirror is spaced-apart from the OPS-structure, thereby forming a resonant cavity with the mirror-structure of the OPS-structure. The resonant cavity, accordingly, includes the gain-structure of the OPS-structure. The mirror-structure and gain-structure are arranged such that QW layers of the gain-structure are spaced apart by one half-wavelength of the fundamental laser wavelength, and correspond in position with antinodes of a standing wave of the fundamental laser-radiation in the resonator. The fundamental-wavelength is characteristic of the composition of the QW layers.

Optical pump-radiation (pump-light) is directed into the gain-structure of the OPS-structure and is absorbed by the separator layers of the gain-structure, thereby generating electrical-carriers. The electrical-carriers are trapped in the QW layers of the gain-structure and recombine. Recombination of the electrical-carriers in the QW layers yields electromagnetic radiation of the fundamental-wavelength. This radiation circulates in the resonator and is amplified by the gain-structure thereby generating laser-radiation.

OPS-lasers have often been used in the prior art as a means of conveniently testing QW structures for later use in electrically pumped semiconductor lasers. More recently, OPS-lasers have been investigated as laser-radiation sources in their own right. The emphasis of such investigation, however, appears to be on providing a compact, even monolithic, device in keeping with the generally compact nature of semiconductor lasers and packaged arrays thereof.

The gain-structure of OPS-structures may be formed from the same wide range of semiconductor-materials/substrate combinations contemplated for diode-lasers. These include, but are not limited to, InGaAsP/InP InGaAs/GaAs, AlGaAs/GaAs, InGaAsP/GaAs and InGaN/Al$_2$O$_3$, which provide relatively broad spectra of fundamental-wavelengths in ranges, respectively, of about 960 to 1800 nanometers (nm); 850 to 1100 nm; 700 to 850 nm; 620 to 700 nm; and 425 to 550 nm. There is, of course, some overlap in the ranges. Frequency-multiplication of these fundamental-wavelengths, to the extent that it is practical, could thus provide relatively broad spectra of radiation ranging from the yellow-green portion of the electromagnetic spectrum well into the ultraviolet portion thereof.

OPS-lasers provide a means of generating wavelengths, in a true CW mode of operation, which can closely match the optimum wavelength for many laser applications, in fields such as medicine, optical metrology, optical lithography, and precision laser machining. In U.S. Pat. No. 6,097,742, granted to Caprara et al. and assigned to the assignee of the present invention, external cavity OPS-lasers capable of delivering 2 W or greater output of fundamental radiation and 100 mW or greater of harmonic radiation are described. These lasers include relatively long resonators, for example from about 10 centimeters (cm) up to one meter (m) or greater, and are designed to provide a relatively large mode size on an OPS-structures.

At any given resonator length and mode spot size, there is a limit to the amount of power that can be generated that is imposed by a limit on the amount of pump power that can be delivered to the OPS-structure without causing a structural failure of some kind. One such structural failure is caused by softening of bonding material used to bond the OPS-structure in thermal contact with a heat sink. Softening of the material can allow the OPS-structure to buckle under intrinsic and thermally imposed stresses.

There is a need for an OPS-laser having a resonator arrangement that can accommodate two or more OPS-structures. More power could be generated than could be generated in a resonator having only one OPS-structure while allowing the individual OPS-structures to be pumped at levels that would not cause failure of the structures. The resonator arrangement should be suitable for delivering either fundamental or harmonic radiation.

BRIEF SUMMARY

In one aspect, the present invention is directed to a laser, comprising at least one composite layer-structure including a multilayer semiconductor gain-structure surmounting a mirror-structure. The mirror-structure is arranged as a resonator mirror of an active unidirectional ring-resonator with the gain-structure located in the ring-resonator. The term "active" here means that the ring-resonator includes a gain-structure. The gain-structure is energized to cause fundamental laser-radiation to circulate in the ring-resonator. An optically nonlinear is crystal located in the ring-resonator and arranged to generate second-harmonic radiation from the fundamental radiation, i.e., to double the frequency of the fundamental radiation. The laser preferably includes two or more of the composite layer-structures with the mirror-structure of each providing a mirror of the ring-resonator.

One embodiment of the inventive laser includes four composite mirror-structures with mirror-structures thereof arranged to provide a four-mirror "bow-tie" type ring-resonator. Another embodiment of the inventive laser includes four of the composite layers structures and two other mirrors-arranged to form a six-mirror, double bow-tie type ring-resonator.

In another aspect of the inventive lasers, embodiments thereof include a passive ring-resonator, arranged to be partially coaxial with the active ring-resonator on at least one common path. The optically nonlinear crystal is located in the common path. The passive ring-resonator circulates the second-harmonic radiation therein. In one embodiment of the inventive laser including a passive ring-resonator for circulating second-harmonic radiation, the active and passive ring-resonators have two common paths. The frequency doubling crystal is located in one of the common paths and another optically nonlinear crystal is located in the other of the common paths and arranged to mix the fundamental and second-harmonic radiations to provide third-harmonic (frequency-tripled) radiation.

In yet another aspect of the present invention a laser comprises a first laser including a gain medium and an arrangement for energizing the gain-medium to cause fundamental laser-radiation to circulate in the first laser-resonator. A first optically nonlinear crystal is located in the first laser-resonator and arranged to convert the fundamental laser-radiation to second-harmonic radiation. A second laser-resonator in the form of a ring-resonator is formed by a plurality of resonator mirrors and arranged to circulate the second-harmonic radiation therein. The second laser-resonator is arranged such that the round-trip path of second-harmonic radiation therein is adjustable. A device is provided for adjusting the length of the round trip path of the second laser-resonator. The first and second laser-resonators are arranged to be partially coaxial, with resonator axes thereof following a common path through the first optically nonlinear crystal. The second laser-resonator is arranged such that a portion of the circulating second-harmonic radiation is delivered therefrom. An electro-optical arrangement including at least one photodetector is provided for receiving and analyzing the second-harmonic radiation for the second laser-resonator. An electrical signal representative of the resonant condition of the second laser-resonator for the second-harmonic radiation circulating therein is derived from the received second-harmonic radiation. The electrical signal is used to cause the round trip path-length adjusting device to adjust the round-trip path length to maximize resonance the second-harmonic radiation circulating in the second laser-resonator.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the present invention.

DETAILED DESCRIPTION

Figure 1:
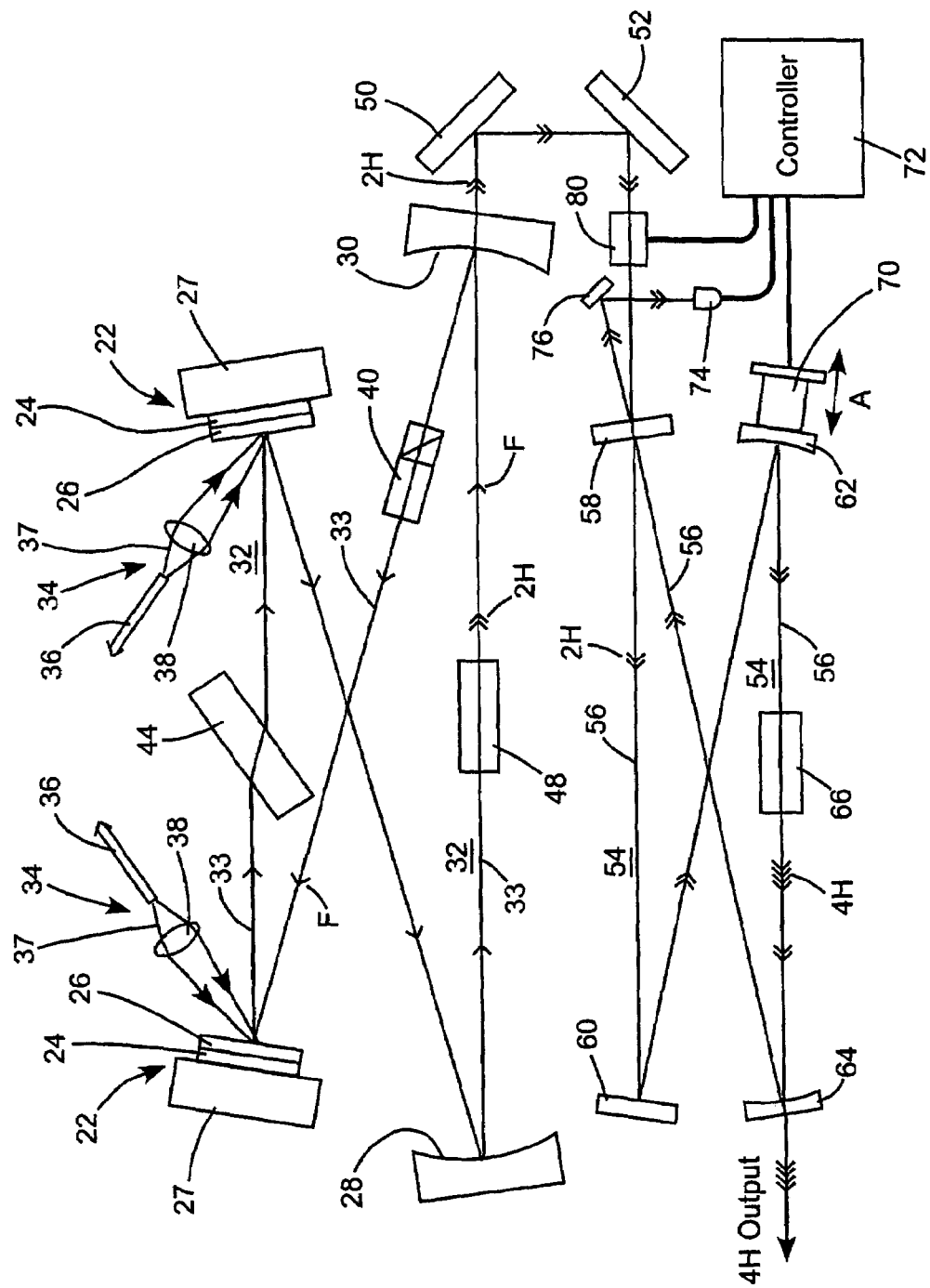
FIG. 1 schematically illustrates a first preferred embodiment of an OPS laser in accordance with the present invention including an active "bow-tie" ring-resonator having two OPS-structures for generating fundamental radiation and a first optically nonlinear crystal arranged to frequency double the fundamental radiation and deliver second harmonic output, the laser further including a separate passive ring-resonator arranged to receive the second harmonic output and having a second optically nonlinear crystal therein arranged to frequency-double the received second harmonic output to provide fourth harmonic output, the passive resonator including an arrangement for, automatically adjusting the length thereof to optimize resonance of second-harmonic radiation therein.

Referring now to the drawings wherein like features are designated by like reference numerals, FIG. 1 schematically illustrates a first preferred embodiment 20 of an OPS laser in accordance with the present invention. Laser 20 includes two OPS-structures 22. Each of the OPS structures is a composite layer-structure having a mirror-structure 24 surmounted by a semiconductor multilayer, surface-emitting gain-structure 26. OPS-structures 22 are each supported on a substrate or heat sink 27, with mirror-structure 24 of the OPS-structure in thermal contact with the substrate. As such OPS-structures are well known in the art, a detailed description thereof is not presented herein. A detailed description of such structures including description of layer materials and their arrangement and heat-sink designs is provided in above-referenced U.S. Pat. No. 6,097,742, the complete disclosure of which is hereby incorporated by reference.

Mirror-structures 24 of the OPS-structures and two concave mirrors 28 and 30 are arranged to form a traveling-wave resonator (ring-resonator) 32 having a folded resonator axis 33. The gain-structures of the OPS-structures are included in the resonator. This resonator and similar resonators described hereinbelow are referred to hereinafter as active resonators to indicate that they include gain-media.

Ring-resonator 32 is a type of ring-resonator often referred to by practitioners of the art as a "bow-tie" ring-resonator because of the manner in which the resonator axis is folded. A bow-tie resonator is preferred in the present invention because it allows circulating radiation to be incident on the OPS-structures at a relatively low angle of incidence, for example, less than about twenty degrees (20°). A low angle of incidence on the OPS-structures simplifies resonator design inasmuch as the design becomes similar to the design for normal incidence. It should be noted, however, that while the bow-tie resonator is preferred in embodiments of the present invention described herein, the use of other types of ring-resonator such as resonators having an axis in a polygonal shape such as a triangle or rectangle is not precluded.

Continuing with reference to FIG. 1, an optical pumping arrangement 34 is provided for each OPS-structure 22. Optical pumping arrangement 34 includes an optical fiber 36 delivering pump light 37 from a diode-laser (not shown). Pump light 37 is focused onto gain-structure 26 of the OPS-structure by a lens 38. It should be noted here that optical pumping arrangement 34 is only one of a number of possible optical pumping arrangements and should not be construed as limiting the present invention. Examples of other pumping arrangements for OPS-structures are described in the above-referenced Caprara et al. patent.

Optically pumping gain-structures 26 causes fundamental radiation to circulate in resonator 32 along folded resonator-axis 33 as indicated by single arrowheads F. The fundamental radiation is constrained to circulate in one direction only by the provision of an optical isolator or "optical diode" 40. The wavelength of the circulating fundamental radiation is selected from a range of wavelengths represented by the gain bandwidth of the OPS-structure. Wavelength selection is effected by a wavelength-selective optical element, here, a birefringent filter 44. The wavelength is selected from a range of possible lasing wavelengths dependent on the material of the gain-structure of the OPS-structures. Another type of wavelength-selective element such as a Fabry-Perot etalon may be used without departing from the spirit and scope of the present invention.

An optically nonlinear crystal 48 is located on resonator axis 33 between concave mirrors 28 and 30 and arranged to double the frequency of fundamental radiation circulating therethrough, thereby generating second-harmonic radiation having a wavelength one-half of that of the fundamental radiation. The concave mirrors are arranged such that circulating fundamental radiation F is formed into a narrow waist (not shown) between the mirrors. Focusing the radiation to the narrow waist increases the intensity of the radiation in the optically nonlinear crystal for increasing the efficiency of conversion to second-harmonic radiation. The direction of travel of second-harmonic radiation is indicated in FIG. 1 by double arrowheads 2H. Mirror 30 is optically coated such that it is highly reflective, for example, greater than about 99% reflective, for fundamental radiation F, and highly transmissive, for example, greater than about 90% transmissive, for second-harmonic radiation 2H to allow the second-harmonic radiation to be delivered from resonator 32. Mirror 28 and mirror-structures 24 are also highly reflective for fundamental radiation F.

Second-harmonic radiation delivered from resonator 32 is directed by mirrors 50 and 52 into a passive bow-tie ring-resonator 54 having a folded resonator axis 56 formed between plane mirrors 58 and 60 and concave mirrors 62 and 64. The term "passive ring-resonator" as used herein means only that the resonator does not include an optical gain-element.

The second-harmonic radiation circulates in resonator 54 around the resonator axis as indicated by double arrowheads 2H. An optically nonlinear crystal 66 is located on axis 56 of the resonator between mirrors 62 and 64 an arranged to double the frequency of the circulating second-harmonic radiation, thereby generating fourth-harmonic radiation having a wavelength one-quarter of that of the fundamental radiation. The fourth-harmonic radiation is indicated in FIG. 1 by quadruple arrowheads 4H. Concave mirrors 62 and 64 are arranged such that circulating second-harmonic radiation 2H is formed into a narrow waist (not shown) between the mirrors for increasing the efficiency of conversion thereof to fourth-harmonic radiation 4H.

As a further measure to increase conversion of second-harmonic radiation, it is preferable to adjust the length of resonator axis 56, i.e., the round-trip path length of second-harmonic radiation in the resonator, such that successive round trips of second-harmonic radiation 2H in the resonator are in phase, i.e., resonator 54 is in a maximally resonant condition for the second-harmonic radiation.

Mirror 62 is driven, as indicated by arrows A, by a piezoelectric driver 70 or the like to adjust the path length for second-harmonic radiation 2H in ring-resonator 54 and maintain the resonator in a resonant condition. Operation of driver 70 is controlled by electronic drive and control circuitry (controller) 72. A preferred control scheme for controlling piezoelectric driver 70 is a Pound-Drever locking scheme. The theory of this control scheme is described in detail in a paper "Laser Phase and Frequency Stabilization using an Optical Resonator", Applied Phys.B, Vol. 31, pp. 97-105, 1983. A description of important elements of the control scheme as it relates to the present invention is set forth below with continuing reference to FIG. 1.

A photodetector 74 is positioned to receive via a mirror 76 any radiation 2H reflected from the back of mirror 58. When resonator 54 is in a resonant condition for radiation 2H, there will be no radiation 2H reflected from mirror 58 onto photodetector 74. A phase-modulator 80 is positioned in the path of radiation 2H before it is injected into resonator 54 through mirror 58. The phase-modulator is arranged and operated at a predetermined frequency, for example, 20 megahertz (MHz), such that the spectrum of radiation leaving the phase-modulator includes a carrier component having the frequency of radiation 2H, and two side-band frequencies, one at a higher frequency and one at a lower frequency than the carrier-component frequency. The side-band frequencies have opposite phase.

When the carrier and side-band frequencies impinge on photodetector 74, the photodetector delivers a signal to controller 72. The signal delivered to controller 72 includes a 40 MHz component, created by beating of the side-band frequencies with each other, and two 20 MHz components having opposite phase, created by beating of the side-band frequencies with the carrier. Controller 72 is arranged to electronically filter the signal from photodetector 74 to remove the 40 MHz component therefrom. The sum of the remaining 20 MHz components provides an error signal for controlling driving of piezoelectric driver. The magnitude of the signal is representative of the difference in path-length for radiation S, in the resonator, from the path-length required for the resonant condition. The sign of the signal provides an indication of whether the path-length is too long or too short. The signal passes from negative to positive, steeply, through zero, which is the value of the signal when resonator 54 is in the resonant condition.

Another possible arrangement for maintaining resonator 54 in a resonant condition is based on a scheme known to practitioners of the art as the Hansch-Couillaud scheme. The theory of this scheme is described in a paper "Laser frequency stabilization by polarization spectroscopy of a reflecting reference cavity", Hansch, T. W.; Couillaud, B., Optics Communications, Vol. 35, No. 3, pp. 441-4 (1980). Important elements of scheme as it applies to the present invention are discussed below with reference to FIG. 1A.

Figure 1A:
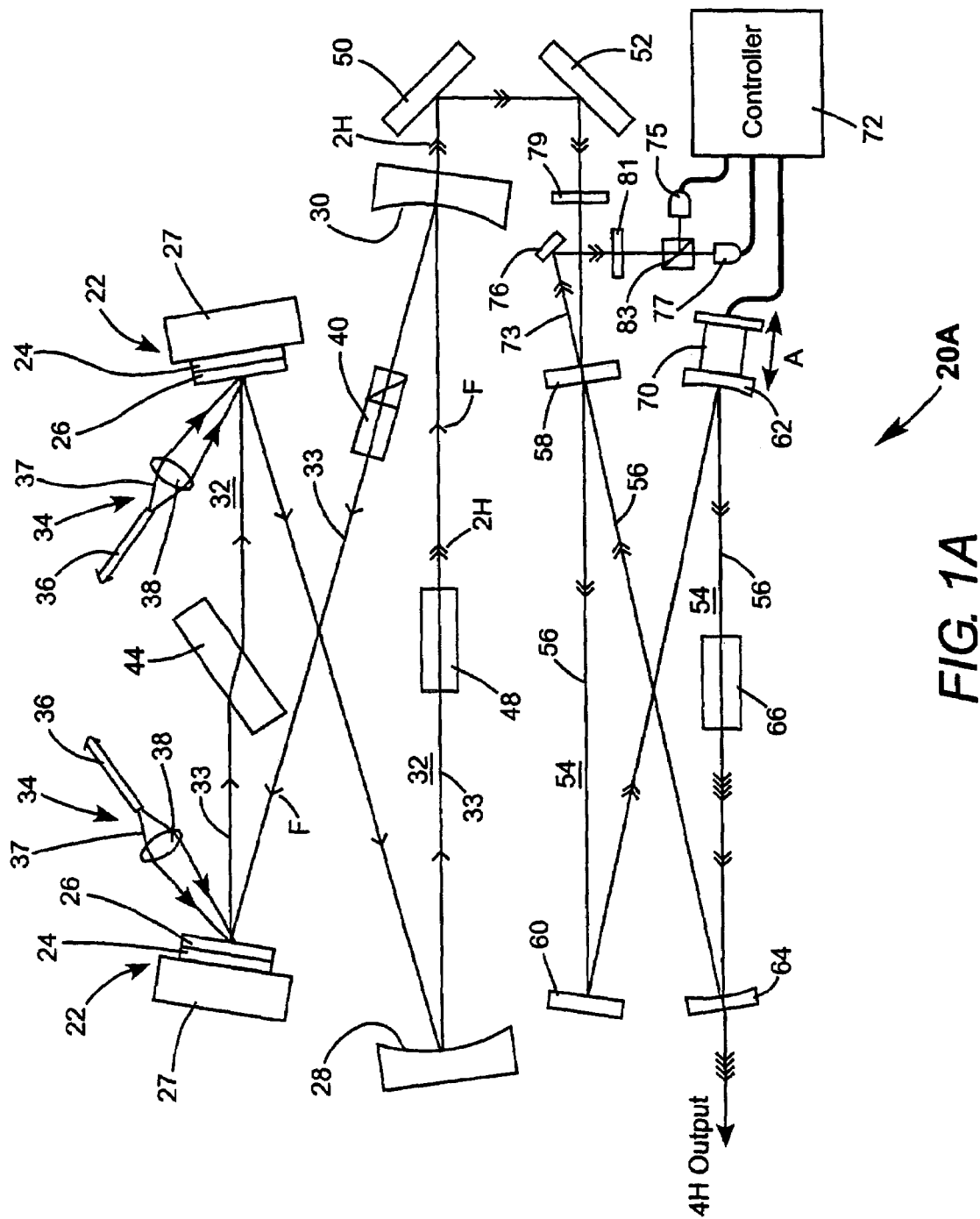
FIG. 1A schematically illustrates an OPS laser similar to the laser of FIG. 1 but wherein the passive resonator includes a different arrangement for automatically adjusting the length thereof to optimize resonance of second-harmonic radiation therein.

FIG. 1A schematically illustrates a modification 20A of above described laser 20. Laser 20A is similar to laser 20 of FIG. 1 except for the method of adjusting the length of resonator 54. In laser 20A, second-harmonic radiation delivered from resonator 32 is directed by mirrors 50 and 52 through a half-wave phase retarder (half-wave plate or polarization rotator) 79. Half-wave plate 79 is adjusted to provide a relatively small rotation or "tilt" of the polarization plane of the second-harmonic radiation before it is injected into resonator 54. Mirror 58 of resonator 54 is made partially transmissive for second-harmonic radiation to allow a portion of the radiation circulating in resonator 54 to "leak" out of the resonator. This leaked portion of the second-harmonic radiation combines in a path 73 with a portion of the input radiation that is reflected from mirror 58.

The combined radiation is directed by mirror 76 through a quarter-wave plate 81 and then to a polarizing beamsplitter 83. Quarter-wave plate 81 is arranged with its axis at 45 degrees to the vertical and horizontal axes of the polarizing beamsplitter. Polarizing beamsplitter 83 resolves the radiation transmitted by quarter-wave plate 81 into plane-polarized components, perpendicularly oriented to each other, one component being reflected by the beamsplitter and the other transmitted by the beamsplitter. The reflected component is received by a photodiode 75. The transmitted component is received by another photodiode 77. Signals from the photodiodes are subtracted by controller 72. The subtracted signals provide an error signal that passes from a positive value to a negative value through a zero value as the length of resonator 54 is adjusted. The zero value occurs when resonator 54 is in a resonant condition for second-harmonic radiation. Controller 72 drives mirror 62 via actuator 70 to maintain the error signal at zero.

It is also possible to simply sample the fourth harmonic output of resonator 54 and drive mirror 62 to maintain the power output at a peak or to lock the power to a predetermined level less than the peak. This method, however, is less reliable than the Pound-Drever or Hansch-Couillaud schemes.

Figure 2:
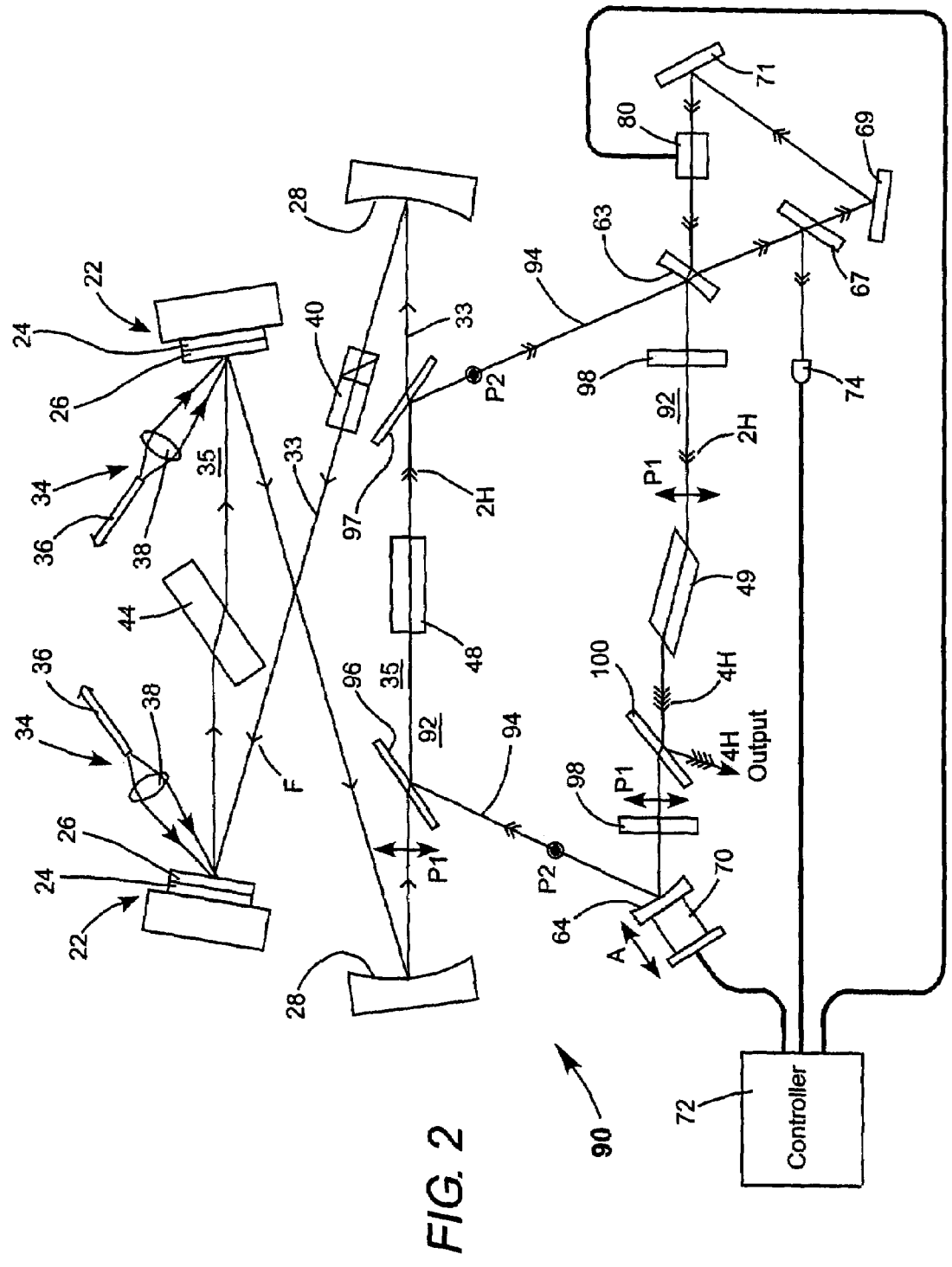
FIG. 2 schematically illustrates a second preferred embodiment of an OPS laser in accordance with the present invention including an active "bow-tie" ring-resonator having two OPS-structures for generating fundamental radiation and a first optically nonlinear crystal arranged to generate second-harmonic radiation from the fundamental radiation, the laser further including a passive ring-resonator arranged to include the first optically nonlinear crystal on a common path of the resonators and having a second optically nonlinear crystal arranged to frequency double the second-harmonic radiation to provide fourth-harmonic radiation, the passive ring-resonator being provided an automatic length adjusting arrangement to maximize resonance of the second-harmonic radiation.

FIG. 2 schematically illustrates a second embodiment 90 of an OPS laser in accordance with the present invention. Laser 90 includes an active ring-resonator including two OPS-structures 22 and an optically nonlinear crystal 48 for doubling the frequency of fundamental radiation F generated in the resonator. Resonator 35 is similar to resonator 32 of FIG. 1 with an exception that concave mirror 30 of resonator 32 is replaced by a concave mirror 28 that does not transmit second-harmonic radiation.

Laser 90 further includes a passive ring-resonator 92 having a resonator axis 94. Resonator axis 94 is folded into the form of a four-sided polygon by plane mirrors 96 and 97 and concave mirrors 64 and 63. Mirrors 96, 63, and 64 are all highly reflective for second-harmonic radiation 2H. Mirrors 96 are also highly transmissive for fundamental radiation F. Fundamental radiation F generated in resonator 35 is plane polarized in the plane of incidence of the radiation on the resonator mirrors as indicated by arrows P1. Accordingly, it is advantageous to arrange that fundamental radiation is incident on mirrors 96 at Brewster's angle to minimize reflection from the second (non-mirror) surface without providing an antireflection coating thereon. An optically nonlinear crystal 49 is located on resonator axis 94 between mirrors 63 and 64 and is arranged to double the frequency of the second-harmonic radiation, thereby generating fourth-harmonic radiation as indicated by arrows 4H.

Resonator 92 is arranged such that a portion of axis 94 thereof between mirrors 96 is coaxial with that portion of axis 33 of resonator 35 between mirrors 96 and 97. Optically nonlinear crystal 48 is located between mirrors 96 and 97. Second-harmonic radiation 2H generated by optically nonlinear crystal 48 is plane polarized in an orientation perpendicular to the orientation of fundamental radiation F as indicated by arrow P2.

Second-harmonic radiation 2H generated by optically nonlinear crystal 48 is directed around resonator 92 by mirror 97. After reflection from mirrors 63, the polarization orientation of the second-harmonic radiation is rotated from orientation P2 to orientation P1 by a polarization-rotating device 98, for example, a half-wave plate. On passage through optically nonlinear crystal 49-a portion of the second-harmonic radiation is converted to fourth-harmonic radiation 4H. The fourth-harmonic radiation is reflected out of resonator 94 by a mirror 100. Mirror 100 is highly transparent for second-harmonic radiation 2H and is preferably oriented for Brewster's angle incidence, for reasons discussed above with reference to mirrors 96 and 97.

That portion of second-harmonic radiation that is not converted to fourth-harmonic radiation is transmitted through mirror 98. The polarization of the transmitted radiation is restored to orientation P2 by a second polarization device 98. The second-harmonic radiation is reflected sequentially by mirrors 64 and 96 back into optically nonlinear crystal 48.

Laser 90 includes an arrangement 93 that allows the above described Pound-Drever method to be implemented for adjusting the round-trip path length of resonator 92, even though second-harmonic radiation 2H originates within the resonator rather than being injected into the resonator from without, as discussed above with reference to laser 20. Mirror 63 of resonator 92 is made partially transparent, preferably less than about 1% transparent, to second-harmonic radiation 2H. A portion of the second-harmonic radiation circulating in resonator 92 is transmitted through the mirror, is transmitted through a 50:50 beamsplitter 67 and is reflected by mirrors 69 and 71, through phase modulator 80, back into resonator 92 via mirror 63 thereof.

If the resonator 92 is not in a maximally resonant condition for the second-harmonic radiation, some portion of the phase-modulated radiation will be reflected as amplitude-modulated radiation from mirror 63 back to beamsplitter 67. A portion of the amplitude-modulated radiation is reflected from mirror 67 onto photodetector 74. The signal is detected using a phase sensitive lock-in amplifier included in controller 72. The in-phase signal at the modulation frequency provides an error signal for driving mirror 64 via piezoelectric actuator 70.

Mirror 64 is movable in the direction indicated by arrows A for varying the length of resonator axis 94 as discussed with reference to passive resonator 54 of FIG. 1. The resonator-axis length is adjusted such that second-harmonic radiation directed into optically nonlinear crystal 48 is in phase with second-harmonic radiation being generated in the crystal from fundamental radiation F transmitted therethrough.

A potential inaccuracy in the above-discussed implementation of the Pound-Drever method may result from unpredictable effects arising from the fact that phase-modulated radiation is transmitted by beamsplitter 67 and is modulated again by phase modulator 80. Such effects will diminish as resonator 92 approaches a resonant condition for the second-harmonic radiation, as a diminishingly small proportion of that twice-modulated radiation will reach photodetector 74. The effects can be minimized, by arranging controller to initially drive mirror 64 to maximize fourth-harmonic power output. As that power approaches a maximum, reflection from mirror 63 will be reduced sufficiently that the effect of twice-modulated radiation can be ignored. Control can then be implemented by monitoring the signal from photodetector 74.

Figure 2A:
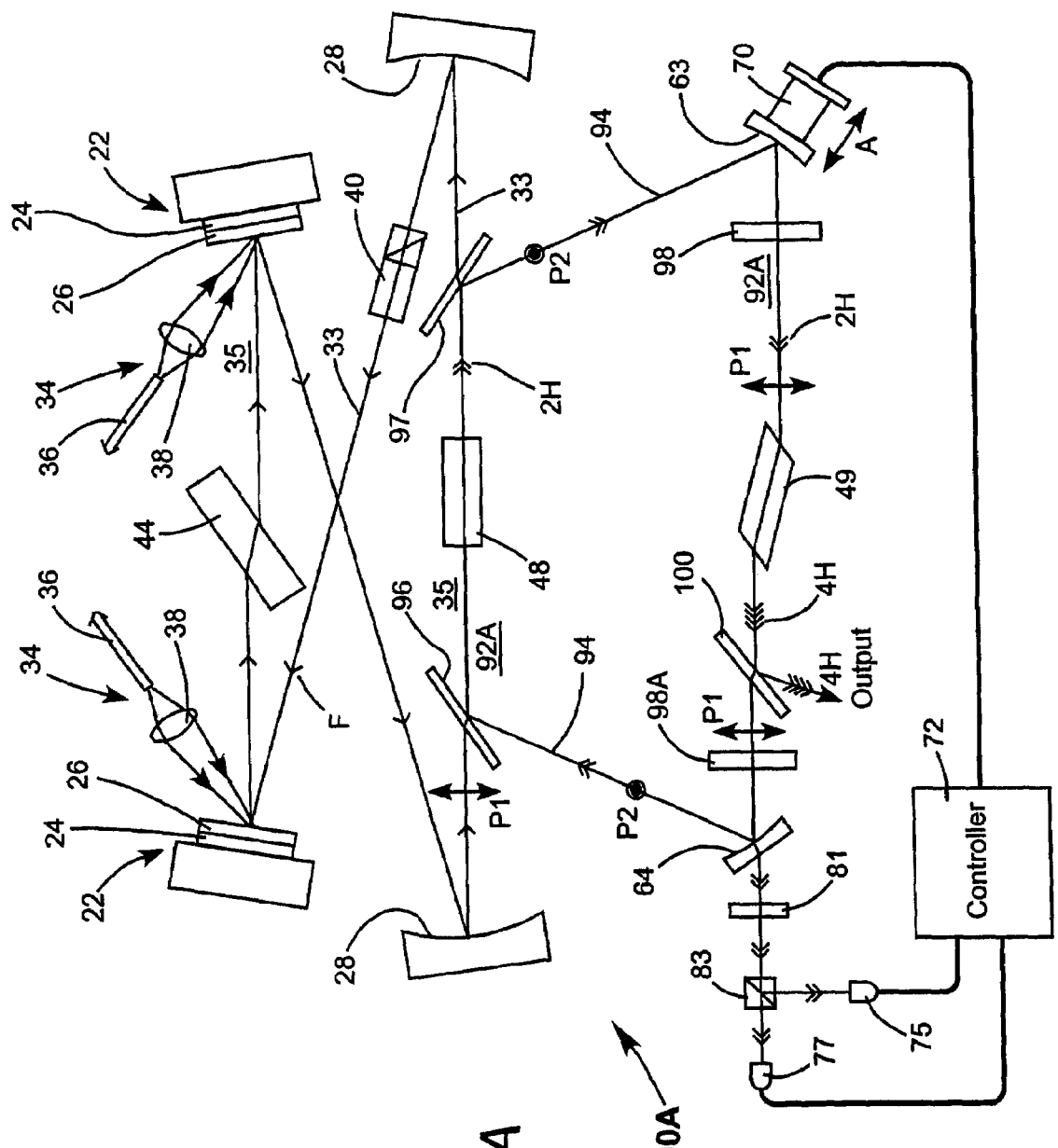
FIG. 2A schematically illustrates an OPS laser similar to the laser of FIG. 2 but wherein the passive resonator includes a different arrangement for automatically adjusting the length thereof to optimize resonance of second-harmonic radiation therein.

An alternative embodiment 90A of laser 90 in which a modification of the above-discussed Hansch-Couillaud method is employed for adjusting the length of resonator 92 is depicted in FIG. 2A. Laser 90A includes a passive resonator 92A similar to resonator 92 of FIG. 2 with an exception that one of the half wave-plates 98 is replaced in resonator 92A with a half-wave plate 98A that is rotated by a few degrees (Q) from the polarization plane P1. Half-wave plate 98A combines the functions of half wave-plate 98 in resonator 90 and half-wave plate 79 in laser 20A of FIG. 1A. Mirror 63 is arranged to be about 1% transmissive for second-harmonic radiation 2H. This allows a sample of the second-harmonic radiation to exit resonator 92. The sampled radiation passes through a quarter-wave plate 81, arranged as discussed above with referenced to laser 20A, and is then separated into polarization components by a polarizing beamsplitter 83. The separated polarization components are detected by photodetectors 77 and 75 and the resulting signals are processed by controller 72, as discussed above with reference to laser 20A of FIG. 1A for driving mirror 64 to adjust the length of resonator 92A.

It should be noted here the inventive polarization dependent and phase-modulation dependent methods of maximizing resonance in a coaxial passive ring resonator are not limited to use the unidirectional OPS ring-resonators described herein. The inventive resonance-maximizing methods for coaxial active laser passive ring-resonators can be used with any active laser-resonator generating fundamental radiation, without departing from the spirit and scope of the present invention.

Figure 3:
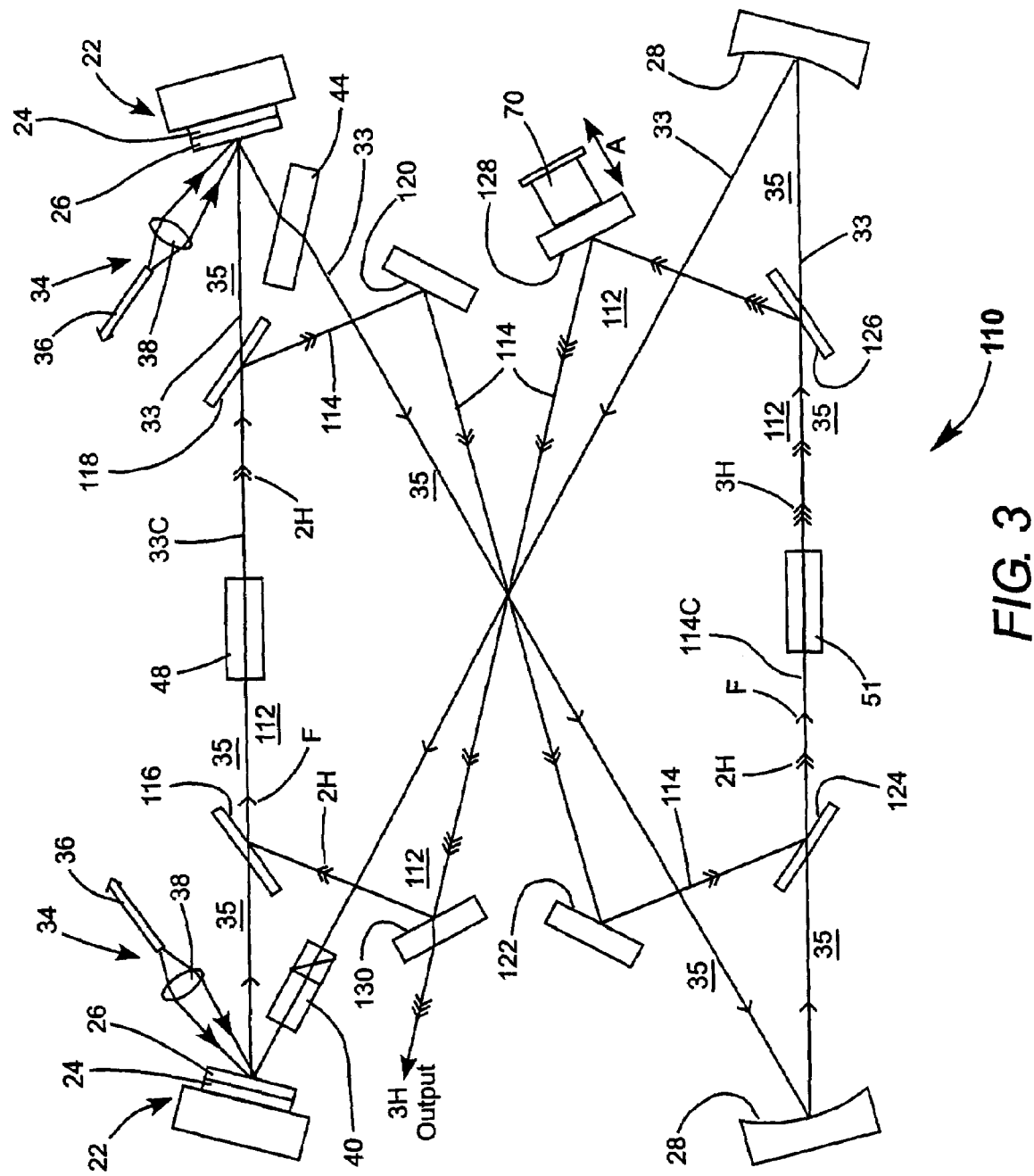
FIG. 3 schematically illustrates a third preferred embodiment of an OPS laser in accordance with the present invention including an active "bow-tie" ring-resonator having two OPS-structures for generating fundamental radiation, a first optically nonlinear crystal for generating second-harmonic radiation from the fundamental radiation and a second optically nonlinear crystal arranged to generate third-harmonic radiation from the fundamental and second-harmonic radiation, the laser further including a passive ring-resonator arranged to circulate the second-harmonic radiation through the first and second optically nonlinear crystals and to deliver the third-harmonic radiation from the laser.

FIG. 3 schematically illustrates a third embodiment 110 of an OPS laser in accordance with the present invention. Laser 110 includes an active ring-resonator 35 including two OPS-structures 22, an optical isolator 40, a birefringent filter 44, and an optically nonlinear crystal 48 arranged for frequency-doubling fundamental radiation generated in the resonator. In laser. 110, optically nonlinear crystal 48, for generating second-harmonic radiation 2H, is located on axis 33 of the resonator between the two OPS-structures.

Laser 110 further includes a passive ring-resonator 112 having a resonator axis 114 folded eight times by plane mirrors 116, 118, 120, 122, 124, 126, 128 and 130. Each of these mirrors is highly reflective for second-harmonic radiation 2H. Mirrors 116, 118, 124 and 126 are each highly transparent for fundamental radiation F. Mirrors 126 and 128 are each highly reflective for radiation 3H (indicated in FIG. 3 by triple arrowheads) having three times the frequency of the fundamental radiation, i.e., third-harmonic radiation. Mirror 130 is highly transparent for third-harmonic radiation 3H.

Resonator axes 33 and 114 are arranged such that they are coaxial (follow a common path) between mirrors 116, and 118 (common path 33C), and between mirrors 124 and 126 (common path 114C). Optically nonlinear crystal 48 is located in common path 33C. A second optically nonlinear crystal is located in common path 114C and arranged to mix fundamental and second-harmonic radiation to generate third-harmonic radiation 3H.

In the arrangement of laser 110, it is not necessary that fundamental radiation be focused to a narrow waist in optically nonlinear crystal 48, i.e., in the frequency doubling crystal. It is, however, preferable to focus fundamental radiation to a narrow waist in optically nonlinear crystal 51 for generating the third-harmonic radiation. Concave mirrors 28 are arranged to provide this focusing as discussed above with reference to laser 20 of FIG. 1.

Second-harmonic radiation generated by optically nonlinear crystal 48 is directed out of common path 33C by mirror 118. That second-harmonic radiation is then sequentially reflected from mirrors 120 and 122 to mirror 124, which directs the second-harmonic radiation along common path 114C of the active and passive resonators into optically nonlinear crystal 51. In optically nonlinear crystal 51, the second-harmonic radiation mixes with fundamental radiation to provide third-harmonic radiation 3H. Any fundamental radiation F that is not converted to third-harmonic radiation is transmitted by mirror 126 and continues to circulate in resonator 35. Any second-harmonic radiation 2H that is not converted to third-harmonic radiation is reflected by mirror 126 along axis 114 of resonator 112 and returns to optically nonlinear crystal 48 via successive reflections from mirrors 128, 130 and 116. Third-harmonic radiation generated in optically nonlinear crystal 51 is reflected by mirrors 126 and 128 and is transmitted out of passive resonator through mirror 130.

Mirror 128 is movable by piezoelectric driver 70 in the direction indicated by arrows A for varying the length of resonator axis 114 as discussed above. The resonator-axis length is adjusted such that the portion of second-harmonic radiation not converted to third-harmonic radiation returns to optically nonlinear crystal 48 in phase with second-harmonic radiation being generated therein from fundamental radiation.

Figure 4:
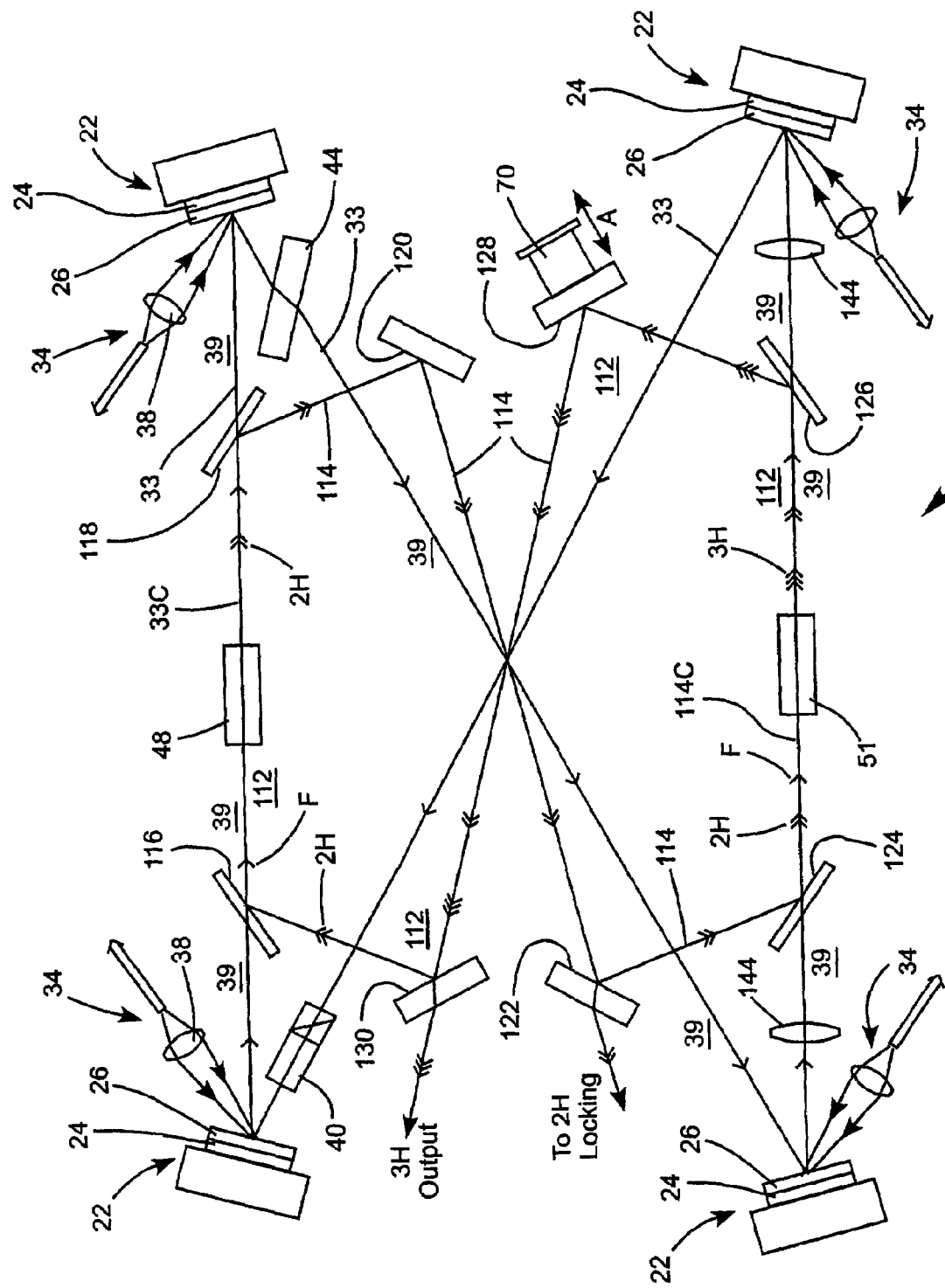
FIG. 4 schematically illustrates a fourth preferred embodiment of an external traveling-wave (ring) resonator OPS laser system in accordance with the present invention similar to the laser system of FIG. 3 but including four OPS-structures for generating the fundamental radiation.

FIG. 4 schematically illustrates a fourth embodiment 140 of an OPS laser in accordance with the present invention, arranged to deliver third-harmonic radiation. Laser 140 includes an active ring-resonator 39, including four OPS-structures 22, and a passive ring-resonator 112. Resonator 112 is arranged to be partially coaxial with resonator 39 on common paths 33C and 114C as described above with reference to laser 110 of FIG. 3. Resonator 39 is similar to resonator 35 of laser 110 of FIG. 3, with an exception that the concave mirrors 28 of resonator 35 have been replaced by two additional OPS-structures, i.e., by mirror-structures 24 of those OPS-structures. This provides additional fundamental power circulating in resonator 39 and, accordingly, additional third-harmonic power output. In order to focus radiation to a narrow waist in optically nonlinear crystal 51, two positive lenses 144 are located on fundamental resonator-axis 33, one before mirror 124 and one after mirror 126 in the direction of circulation of fundamental radiation.

Figure 5:
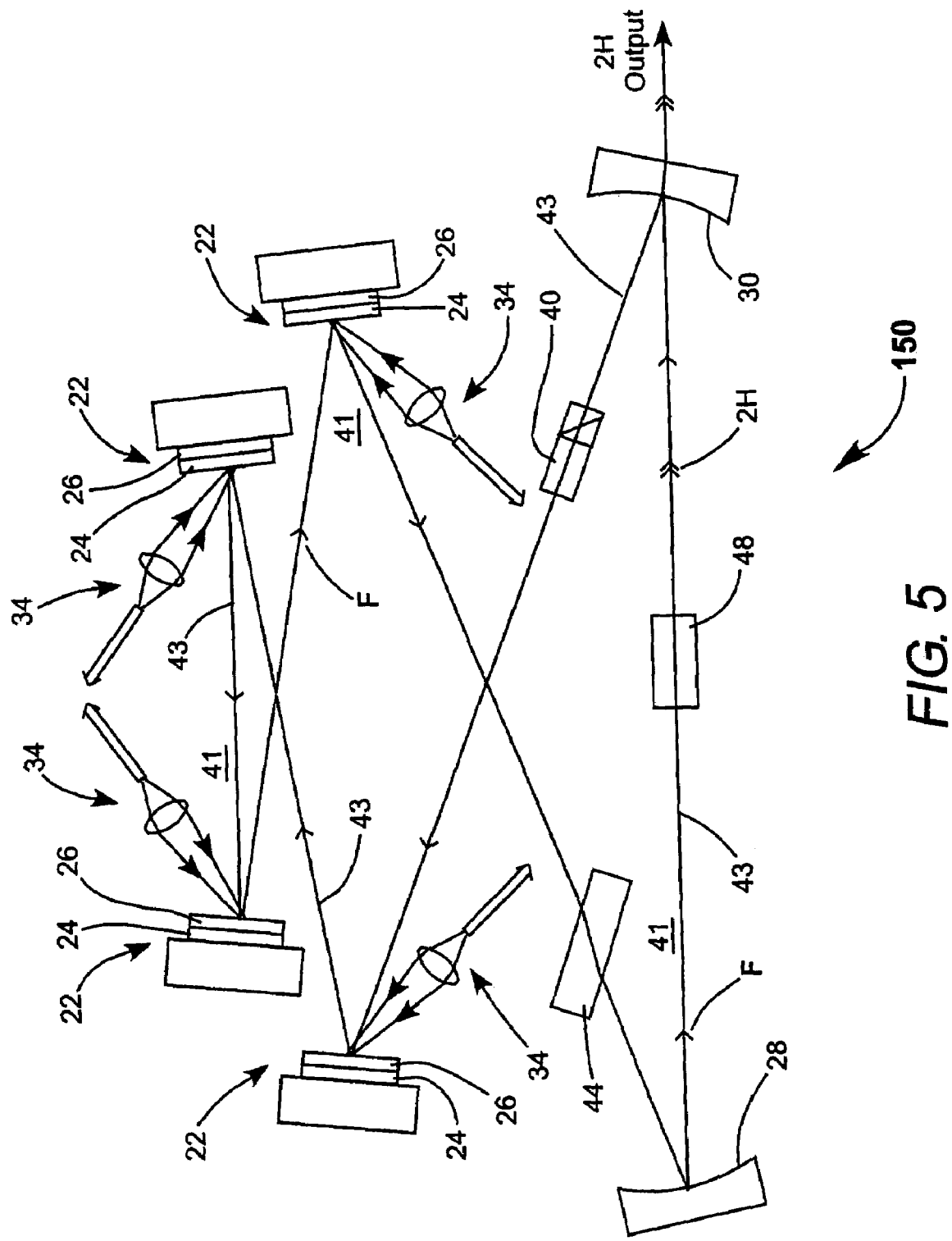
FIG. 5 schematically illustrates a fifth preferred embodiment of an OPS laser in accordance with the present invention including a double "bow-tie" ring-resonator having four OPS-structures for generating fundamental radiation and an optically nonlinear crystal arranged to generate second-harmonic radiation from the fundamental radiation.

FIG. 5 schematically illustrates a fifth embodiment 150 of an OPS-laser in accordance with the present invention. Laser 150 includes a ring-resonator 41 including four OPS-structures 22. Resonator 41 has a resonator axis folded six times in what might be described as a double bow-tie form. Four folds of the axis are provided by mirror-structures 24 of the OPS resonators and two folds are provided by concave mirrors 28 and 30. Here again, the concave mirrors are arranged to focus circulating fundamental radiation F into a narrow waist at a location therebetween. An optically nonlinear crystal 48, arranged for doubling the fundamental radiation is located between the concave mirrors at about the waist location. Mirror 30 is highly transparent for second-harmonic radiation 2H generated by optically nonlinear crystal 48 and serves to deliver second-harmonic radiation, as output radiation, from the resonator.

Resonator 41 of laser 150 has an advantage that four OPS-structures can be accommodated therein while still providing concave mirrors for focusing fundamental radiation to a narrow waist in the optically nonlinear crystal. Such mirrors are preferred over the intra-resonator lenses 114 of resonator 39 of laser 140 (see FIG. 4). Intra cavity lenses must be provided with antireflection coatings to reduce resonator losses. Such coatings can be prone to optical damage at high intracavity power densities, for example about 1 Megawatt per square centimeter (MW/cm$^2$). Those skilled in the art will recognize that in embodiments of the present invention described herein that include concave mirrors, a concave mirror could be functionally replaced (optically at least) by a combination of a plane mirror and a lens. However, considering the above-discussed potential disadvantage of including a lens in a resonator, there is no particular incentive to do so.

Those skilled in the art will recognize that resonator 41 may be used in conjunction with a separate passive ring-resonator such as resonator 54 of FIG. 1, for providing fourth-harmonic radiation by doubling the frequency of the second-harmonic output radiation. Resonator 41 may also be used with a partially-coaxial passive resonator such as resonator 92 of FIG. 2 for providing fourth-harmonic radiation by doubling the frequency of second-harmonic radiation.

Figure 6:
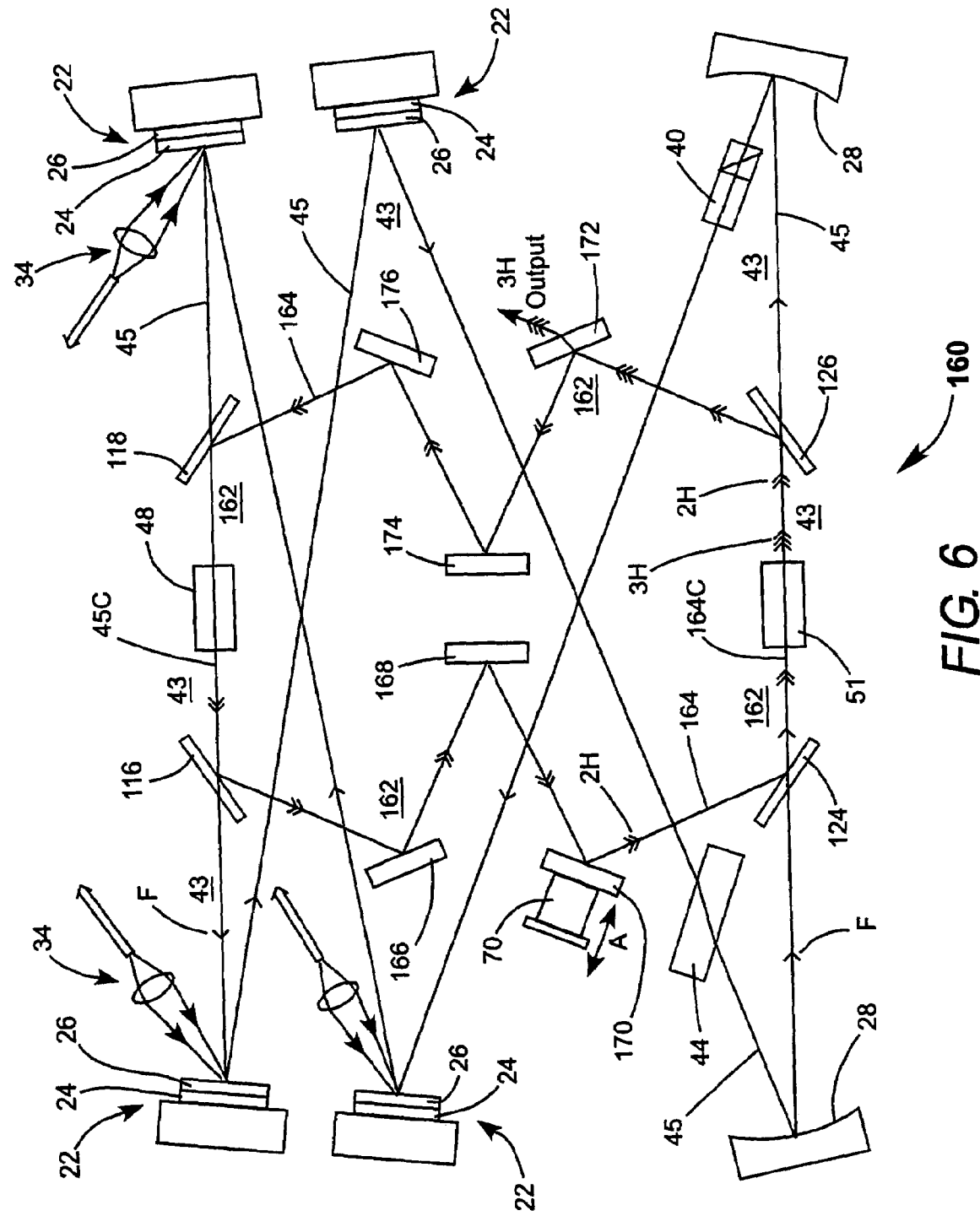
FIG. 6 schematically illustrates a sixth preferred embodiment of an OPS laser in accordance with the present invention including a double "bow-tie" ring-resonator having four OPS-structures similar to the resonator of FIG. 5 and a passive ring-resonator partially coaxial with the double bow-tie resonator and including two optically nonlinear crystals arranged to generate third-harmonic radiation from fundamental radiation circulating in the double bow-tie resonator.

FIG. 6 schematically illustrates another embodiment 160 of a ring-resonator OPS laser in accordance with the present invention arranged for generating third-harmonic radiation from fundamental and second-harmonic radiation. Laser 160 includes an active ring-resonator 43 having a resonator axis 45. Resonator 43 includes four OPS-structures 22 and two concave mirrors 28. Resonator 43 is similar to resonator 41 of FIG. 5 with an exception that neither of the concave mirrors is used as an output mirror. Laser 160 further includes a passive ring-resonator 162 having a resonator-axis 164 folded 10 times by mirrors 116, 166, 168, 170, 124, 126, 172, 174, 176, and 118. Resonator axes 45 and 164 follow a common path 45C (are coaxial) between mirrors 116 and 118, and a common path 164C between mirrors 124 and 126.

An optically nonlinear crystal 48 is located on common path 45C for doubling the frequency of fundamental radiation F to provide second-harmonic radiation 2H. An optically nonlinear crystal 51 is located on common path 164C for mixing fundamental radiation F with second-harmonic radiation 2H to generate third-harmonic radiation 3H. Third-harmonic radiation 3H is delivered from resonator 162 via mirror 172 thereof. Laser 160 operates essentially in the same way as laser 110 of FIG. 3 but with differently configured active and passive ring-resonators. Mirror 170 is movable by piezoelectric driver 70 in the direction indicated by arrows A for varying the length of resonator axis 164 as discussed above. The resonator-axis length is adjusted such that portion of second-harmonic radiation not converted to third-harmonic radiation returns to optically nonlinear crystal 48 in phase with second-harmonic radiation being generated in that optically nonlinear crystal.

It should be noted here that while embodiments of the inventive laser are described herein as including optically pumped semiconductor gain structures the embodiments are applicable for used with electrically-pumped surface emitting gain structures. In practice, however, some difference in performance is to be expected.

The present invention is described above in terms of a preferred and other embodiments. The invention is not limited, however, to the embodiments described and depicted herein. Rather the invention is limited only by the claims appended hereto.

What is claimed is:

1. A laser, comprising:
   first and second composite layer-structures, each thereof including a multilayer semiconductor gain-structure surmounting a mirror-structure;
   first and second mirrors, said first and second mirrors and said mirror-structures being arranged as resonator mirrors of a first unidirectional ring-resonator with said gain-structures of said composite layer-structures located in said first ring-resonator;
   an arrangement for energizing said gain-structures to cause fundamental laser-radiation to circulate in said first ring-resonator;
   a first optically nonlinear crystal located in said first ring-resonator and arranged to convert said fundamental laser-radiation to second-harmonic radiation; and
   a second ring-resonator arranged to circulate said second-harmonic radiation therein, said first and second ring-resonators being arranged to be partially coaxial with resonator axes thereof following a common path through said first optically nonlinear crystal.

2. The laser of claim 1, wherein a round trip path length in said second ring-resonator is adjustable for optimizing resonance of said second-harmonic radiation circulating therein.

3. The laser of claim 1, wherein said first and second ring-resonators are arranged such that said fundamental and second-harmonic radiations traverse said first optically nonlinear crystal in the same direction.

4. The laser of claim 3, wherein said second ring-resonator further includes a second optically nonlinear crystal located on said resonator axis thereof outside of said common path and arranged to convert said second-harmonic radiation into fourth-harmonic radiation.

5. The laser of claim 4, wherein said second ring-resonator further includes an output mirror arranged to direct said fourth-harmonic radiation out of said second ring-resonator.

6. The laser of claim 5, wherein said common path of said resonator axes is on a portion of said first-resonator axis between said first and second mirrors of said first ring-resonator.

7. The laser of claim 6, wherein said second ring-resonator is formed by third, fourth, fifth and sixth mirrors, said third and fourth resonator mirrors being located on said first resonator axis between said first and second mirrors, said common path being located between said third and fourth mirrors and said second optically nonlinear crystal being located on said second-resonator axis between said fifth and sixth mirrors.

8. The laser of claim 7, wherein said fourth and fifth mirrors are concave mirrors arranged to focus said circulating fundamental radiation to a narrow waist therebetween.

9. The laser of claim 1, wherein said first and second mirrors are concave mirrors arranged to focus said circulating fundamental radiation to a narrow waist therebetween.

10. The laser of claim 1, wherein said first ring-resonator is a bow-tie type ring-resonator.

11. A laser, comprising:
at least first and second composite layer-structures, each thereof including a multilayer semiconductor gain-structure surmounting a mirror-structure;
said mirror-structures being arranged as resonator mirrors of a first unidirectional ring-resonator with said gain-structures of said composite layer-structures located in said first ring-resonator;
an arrangement for energizing said gain-structures to cause fundamental laser-radiation to circulate in said ring-resonator;
a first optically nonlinear crystal located in said first ring-resonator and arranged to convert said fundamental laser-radiation to second-harmonic radiation;
a second optically nonlinear crystal located in said first ring-resonator and arranged to mix said fundamental and second-harmonic radiations to provide third-harmonic radiation; and
a second ring-resonator arranged to circulate said second-harmonic radiation therein, said first and second ring-resonators being arranged to be partially coaxial, with resonator axes thereof following a first common path through said first optically nonlinear crystal and a second common path through said second optically nonlinear crystal.

12. The laser of claim 11, wherein the round trip path length of said second ring-resonator is adjustable for optimizing resonance of said second-harmonic radiation circulating therein.

13. The laser of claim 11, wherein there are first second third and fourth ones of said composite layer-structures, mirror-structures of each thereof being arranged as resonator mirrors of said first ring-resonator, with said composite layer-structures numbered in order in the circulation-direction of fundamental radiation in said first ring-resonator.

14. The laser of claim 13, wherein said first common path is located on a first portion of said resonator axis of said first ring-resonator between said first and second mirrors thereof and said second common path is located on a second portion of said resonator axis of said first ring-resonator between said third and fourth mirrors thereof.

15. The laser of claim 14, wherein said second ring-resonator is formed by at least first, second, third, and fourth plane mirrors numbered in order in the direction of circulation of said second-harmonic radiation therein, said first common path being between said first and second plane mirrors and said second common path being between said third and fourth plane mirrors.

16. The laser of claim 15, further including first and second positive lenses, said first positive lens being located on said first ring-resonator axis between said third composite structure and said third plane mirror and said second positive lens being located on said first ring-resonator axis between said fourth composite structure and said fourth plane mirror, said first and second positive lenses being configured to focus said circulating fundamental radiation to a narrow waist therebetween.

17. The laser of claim 11, wherein said first ring-resonator is formed between said mirror-structures of said first and second composite layer-structures and first and second mirrors.

18. The laser of claim 17, wherein said first common path is located on a first portion of said resonator axis of said first ring-resonator between said first and second composite layer-structures thereof and said second common path is located on a second portion of said resonator axis of said first ring-resonator between said first and second mirrors thereof.

19. The laser of claim 18, wherein said second ring-resonator is formed by at least third, fourth, fifth, and sixth mirrors located on said first-resonator axis and numbered in order in the direction of circulation of said second-harmonic radiation, said first common path being between said third and fourth mirrors and said second common path being between said fifth and sixth mirrors.

20. The laser of claim 19, wherein said first and second mirrors are concave mirrors arranged to focus said circulating fundamental radiation to a narrow waist therebetween.

21. The laser of claim 11, wherein said first ring-resonator is a bow-tie type ring-resonator.

22. The laser of claim 21, wherein said second ring-resonator is a bow-tie type ring resonator.

23. A laser, comprising:
first, second, third, and fourth composite layer-structures, each thereof including a multilayer semiconductor gain-structure surmounting a mirror-structure;
said mirror-structures being arranged cooperative with first and second mirrors as resonator mirrors of a first unidirectional ring-resonator with said gain-structures of said composite layer-structures located in said ring-resonator;
an arrangement for energizing said gain-structures to cause fundamental laser-radiation to circulate in said first ring-resonator, said mirror-structures and said mirrors being numbered in the direction of circulation of said fundamental radiation in said ring-resonator, with said mirrors between said fourth and first composite layer-structures; and
a first optically nonlinear crystal located in said ring-resonator between said first and second mirrors and arranged to convert said fundamental laser-radiation to second-harmonic radiation.

24. The laser of claim 23, wherein said first and second mirrors are concave mirrors arranged to focus said circulating fundamental radiation to a narrow waist therebetween.

25. The laser of claim 23, wherein one of said first and second mirrors is transparent to said second-harmonic radiation for delivering said second-harmonic radiation from said ring-resonator.

26. A laser, comprising:
first, second, third, and fourth composite layer-structures, each thereof including a multilayer semiconductor gain-structure surmounting a mirror-structure;
said mirror-structures being arranged cooperative with first and second mirrors as resonator mirrors of a first unidirectional ring-resonator with said gain-structures of said composite layer-structures located in said first ring-resonator;
an arrangement for energizing said gain-structures to cause fundamental laser-radiation to circulate in said first ring-resonator, said mirror-structures and said mirrors being numbered in the direction of circulation of said fundamental radiation in said first ring-resonator, with said mirrors between said fourth and first composite layer-structures; and
a first optically nonlinear crystal located in said first ring-resonator between said second and third mirror structures and arranged to convert said fundamental laser-radiation to second-harmonic radiation;
a second optically nonlinear crystal located in said first ring-resonator between said first and second mirrors and arranged to mix said fundamental and second-harmonic radiations to provide third-harmonic radiation; and
a second ring-resonator arranged to circulate said second-harmonic radiation therewithin, said first and second ring-resonators being arranged to be partially coaxial, with resonator axes thereof following a first common path through said first optically nonlinear crystal and second common path through said second optically nonlinear crystal.

27. The laser of claim 26, wherein said first common path is located on a first portion of said first-resonator axis between said first and second composite layer-structures and said second common path is located on a second portion of said first-resonator axis between said first and second mirrors.

28. The laser of claim 26, wherein the round trip path length in said second ring-resonator is adjustable for optimizing resonance of said second-harmonic radiation therein.

29. The laser of claim 26, wherein said first ring-resonator is a double bow-tie type ring-resonator.

30. The laser of claim 29, wherein said second ring-resonator is a double bow-tie type ring resonator.

31. A laser, comprising:
a first laser-resonator including a gain medium;
an arrangement for energizing said gain-medium to cause fundamental laser-radiation to circulate in said first ring-resonator;
a first optically nonlinear crystal located in said first laser-resonator and arranged to convert said fundamental laser-radiation to second-harmonic radiation;
a second laser-resonator in the form of a ring-resonator formed by a plurality of resonator mirrors and arranged to circulate said second-harmonic radiation therein said second-harmonic radiation following a round-trip path in said second laser-resonator, said second laser resonator being arranged such that the length of said round-trip path is adjustable, said first and second laser-resonators being arranged to be partially coaxial, with resonator axes thereof following a common path through said first optically nonlinear crystal, and said second laser-resonator is arranged such that a portion of said circulating second-harmonic radiation is delivered therefrom;
a device for adjusting the length of said round trip path of said second laser-resonator; and
an electro-optical arrangement including at least one photodetector for receiving and analyzing said second-harmonic radiation and deriving therefrom an electrical signal representative of the resonant condition of said second laser-resonator for said second-harmonic radiation circulating therein, said electrical signal being used to cause said round trip path-length adjusting device to adjust said round-trip path length to maximize resonance of said-harmonic radiation circulating in said second-laser resonator.

32. The laser of claim 31, wherein said electro-optical arrangement includes means for separating said received portion of said second-harmonic radiation into two plane-polarized components, said resonant condition of said second-harmonic radiation being derived from the relative magnitude of said two plane polarized components.

33. The laser of claim 31, wherein said electro-optical arrangement includes a phase modulator, means for delivering a fraction of said received portion of said second-harmonic radiation to said phase modulator to be phase modulated thereby and returning said phase-modulated fraction into said second ring-laser via one of said plurality of mirrors thereof, a portion of said phase-modulated fraction being reflected from said mirror, said electrical signal being derived from said reflected portion of said phase-modulated fraction of said second-harmonic radiation.

34. The laser of claim 31, wherein the second-harmonic radiation received by said photodetector is transmitted through a resonator mirror of said second laser-resonator.

35. The laser of claim 31, wherein said second laser-resonator includes a second optically nonlinear crystal.

\* \* \* \* \*